United States Patent
Gerber

(10) Patent No.: US 8,288,672 B2
(45) Date of Patent: Oct. 16, 2012

(54) KEYPAD SYSTEM AND KEYPAD WITH ENHANCED SECURITY

(75) Inventor: Steve Gerber, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 369 days.

(21) Appl. No.: 12/770,911

(22) Filed: Apr. 30, 2010

(65) Prior Publication Data

US 2011/0266128 A1 Nov. 3, 2011

(51) Int. Cl.
*H01H 1/10* (2006.01)
*H01H 11/00* (2006.01)
(52) U.S. Cl. ......... 200/512; 200/600
(58) Field of Classification Search ......... 200/512, 200/600; 345/173
See application file for complete search history.

(56) References Cited

U.S. PATENT DOCUMENTS

| | | | |
|---|---|---|---|
| 4,609,791 A | 9/1986 | Abbat | |
| 4,716,262 A * | 12/1987 | Morse | 200/515 |
| 4,857,683 A * | 8/1989 | Maser | 200/512 |
| 4,857,684 A * | 8/1989 | Gratke | 200/600 |
| 4,901,074 A * | 2/1990 | Sinn et al. | 200/512 |
| 4,920,342 A * | 4/1990 | Gratke | 200/600 |
| 5,486,824 A | 1/1996 | Kinerk et al. | |
| 5,965,886 A * | 10/1999 | Sauer et al. | 250/332 |
| 2009/0135157 A1 * | 5/2009 | Harley | 345/174 |

* cited by examiner

*Primary Examiner* — Briggitte R Hammond
(74) *Attorney, Agent, or Firm* — Polansky & Associates, P.L.L.C.; Paul J. Polansky

(57) ABSTRACT

In one form, a keypad includes a substrate and a flexible membrane disposed above a top surface of the substrate. The substrate has the top surface, a first conductor below the top surface, an insulator layer separating the first conductor from the top surface, and a second conductor disposed in proximity to the first conductor and to the top surface and coupled to a voltage terminal. The flexible membrane is disposed above the top surface of the substrate and has a third conductor forming a key. The third conductor is movable relative to the top surface. In another form, a keypad system includes such a keypad and a capacitive sensing circuit coupled to the first conductor for sensing a change in capacitance between the first conductor and the voltage terminal when the third conductor moves relative to the top surface.

21 Claims, 4 Drawing Sheets

KEYPAD SYSTEM AND KEYPAD WITH ENHANCED SECURITY

FIELD OF THE DISCLOSURE

The present disclosure relates generally to keypads, and more particularly to keypads with security features.

BACKGROUND

Keypads are common input/output devices used in computer systems, cell phones, appliances, automated teller machines (ATMs), and the like. A keypad electrically senses the depression of one or more keys by the user and provides corresponding signals to other circuitry, such as a microprocessor or microcontroller, for processing.

Some keypad applications require enhanced security features. For example, an ATM keypad is susceptible to hacking whereby a hacker can solder wires surreptitiously to the key sensors to detect personal identification codes as they are entered by an unsuspecting user.

There are several known anti-theft measures for keypads, including electrical sensors that detect attempts to desolder integrated circuits, which sensing can be used to shut down the system. Other sensors can detect attempts to separate layers of the keypads to tap into the key sensors. While these techniques make it more difficult for hackers to tap into the key sensors, new and better techniques would be desirable.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
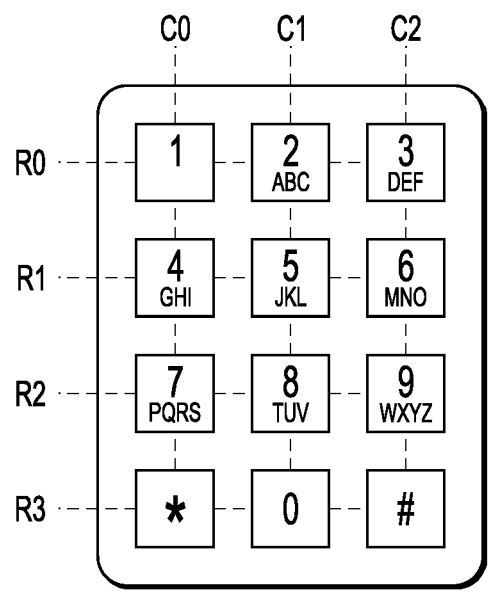
FIG. 1 illustrates a top view of a keypad known in the prior art.

FIG. 1 illustrates a top view of a keypad 100 known in the prior art. Keypad 100 is a standard North American telephone keypad. As is typical of many but not all keypads, keypad 100 is formed of a matrix of keys at the intersections of rows and columns. Keypad 100 has four rows labeled "R0", "R1", "R2", and "R3", and three columns labeled "C0", "C1", and "C2". For example, the number 5 key is located at the intersection of R1 and C1. The top of the keypad typically includes relatively hard plastic keys that are movable in the downward direction. Beneath each key is a key sensor that detects the depression of the key. A typical key sensor uses a layer of metal at the bottom of the movable portion of the key that when depressed shorts two underlying metal electrodes and thus the depression of the key can be easily detected.

Figure 2:
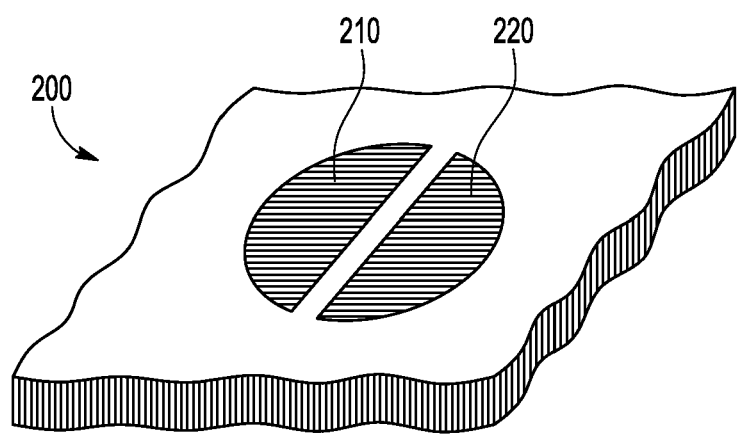
FIG. 2 illustrates a perspective view of a portion of a substrate with a key sensor known in the prior art.

An example of such a key sensor is shown in FIG. 2, which illustrates a perspective view of a portion of a printed circuit board substrate 200 with a key sensor known in the prior art. The key sensor includes a first metallic portion 210 and a second metallic portion 220 at the top surface of substrate 200. Overlying the key sensor is a movable key which, when depressed, shorts metallic portion 210 to 220. The short circuit can be detected by circuitry not shown in FIG. 2. A keypad system built using the key sensor of FIG. 2 is suitable for non-secure applications but would be easy to hack without additional security features.

Figure 3:
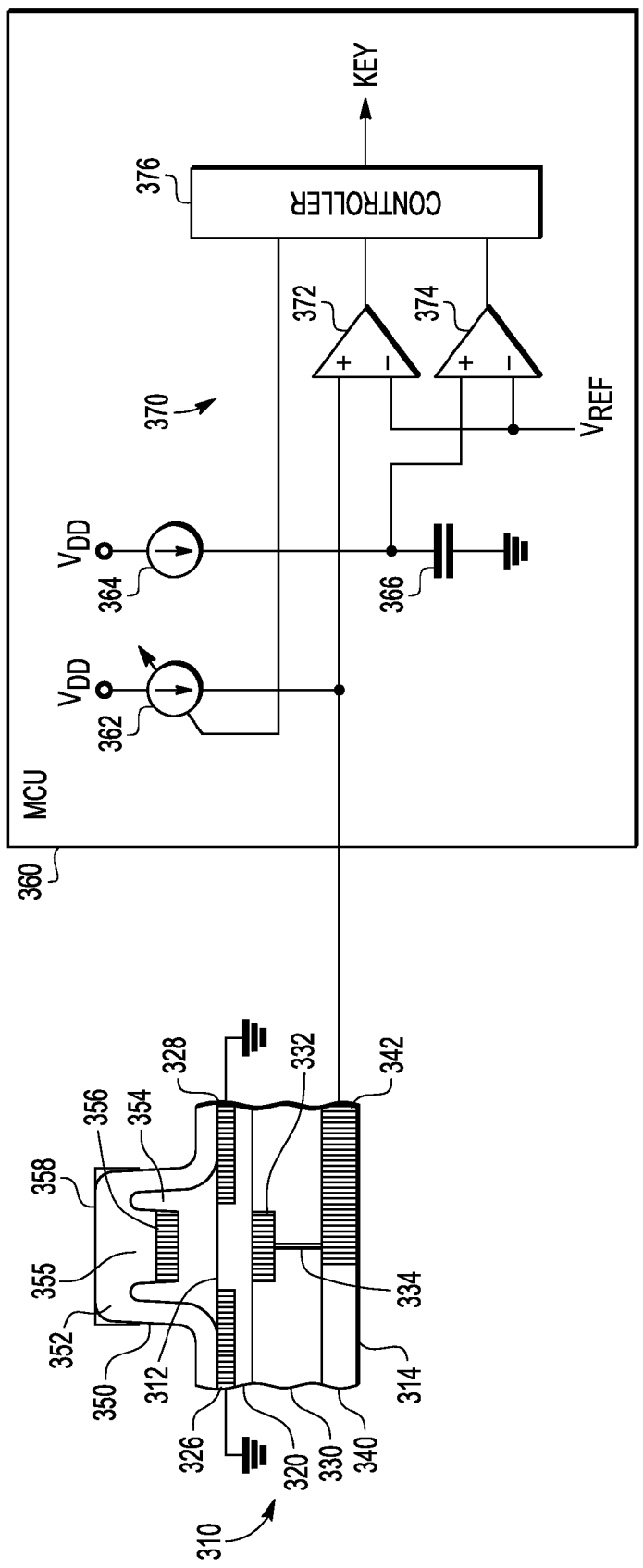
FIG. 3 illustrates a portion of a keypad system according to an embodiment of the present invention, including a cross section of a printed circuit board substrate corresponding to one key and a partial block and partial circuit diagram of a capacitive sensing circuit suitable for use therewith.

FIG. 3 illustrates a portion of a keypad system 300 according to an embodiment of the present invention, including a cross section of a printed circuit board (PCB) substrate 310 corresponding to one key and a partial block and partial circuit diagram of a capacitive sensing circuit 360 suitable for use therewith. PCB substrate 310 includes a top surface 312, a bottom surface 314, and a plurality of layers including a top layer 320, a middle layer 330, and a bottom layer 340. Top surface 312 defines a keypad side of PCB substrate 310, while bottom surface 314 defines an active side of PCB substrate 310. Top layer 320 is made of an electrically insulative material such as fiberglass. Top layer 320 includes conductors 326 and 328 which may be formed by patterning and etching a metal film disposed on top surface 312, or by any other conventional process. Conductors 326 and 328 are each connected to earth ground and are cuts of a ring. Middle layer 330 includes a conductor 332 formed on a top portion that is connected to a bottom surface thereof by an electrically conductive through-hole 334. Bottom layer 340 includes a conductor 342. Bottom surface 314 forms the active surface of PCB substrate 310. Attached to bottom surface 314 are various integrated circuit components, discrete electrical elements like resistors and capacitors, and the like, which are not shown in FIG. 3.

Overlying and adjacent to PCB substrate 310 is a flexible membrane or mat 350. Flexible membrane 350 has a set of outward protrusions corresponding to each key of the keypad such as outward protrusion 352 shown in FIG. 3. Outward protrusion 352 has an inner cavity 354. Within inner cavity 354 is an inward protrusion 355 that extends a portion but not all of the way to the bottom extent of flexible membrane 350. Attached to the bottom of inward protrusion 355 is a conductor 356, also known as a plunger.

Overlying flexible membrane 350 is a cap 358. Cap 358 is formed of a hard material such as plastic or metal. The top surface of cap 358 is engraved with writing, a number, or a symbol that identifies the meaning of the key. For example if the portion of keypad system 300 shown in FIG. 3 corresponds to the number 5 key, the top of metallic cap would include the writing "5/JKL" as illustrated in FIG. 1. Note that other, conventional features of the keypad, such as the frame to hold the key caps in place, are not important to understanding the concepts described herein and will not be described in detail.

In FIG. 3, capacitive sensing circuit 360 is formed by a microcontroller (MCU). Capacitive sensing circuit 360 includes variable current sources 362 and 364, a capacitor 366, and a sensing circuit 370. Current source 362 has a first terminal connected to a power supply voltage terminal labeled "$V_{DD}$", a second terminal connected to conductor 342, and a control terminal. $V_{DD}$ is a power supply voltage that is positive with respect to ground, having a nominal voltage of, for example, 2.0 volts. Current source 364 has a first terminal connected to $V_{DD}$, and a second terminal.

Capacitor 366 has a first terminal connected to the second terminal of current source 364, and a second terminal connected to ground.

Sensing circuit 370 includes comparators 372 and 374 and a controller 376. Comparator 372 has a positive terminal connected to conductor 342, a negative terminal for receiving a reference voltage labeled "$V_{REF}$", and an output terminal. $V_{REF}$ is a reference voltage in between $V_{DD}$ and ground, such as 1.0 volts. Comparator 374 has a positive terminal connected to the first terminal of capacitor 366, a negative terminal for receiving $V_{REF}$, and an output terminal. Controller 376 has input terminals connected to the output terminals of comparators 372 and 374, an output terminal connected to the control terminal of or current source 362, and an output terminal for providing a signal labeled "KEY".

In operation, when a user presses the key shown in FIG. 3, capacitive sensing circuit 360 detects a change in capacitance and provides the KEY output signal in response. A fixed capacitor is formed between conductor 332, forming the first plate, and conductors 326 and 328, forming the second plate. Note that only one of conductors 326 and 328 is required, and substrate 310 can actually include a single conductor forming a continuous capacitive plate for all keys of the keypad. When the key is depressed, conductor 356 moves downward into proximity with top surface 312 such that it becomes substantially adjacent thereto, which creates additional capacitance to ground between conductor 332 and ground. Conductor 356 may come into physical and electrical contact with conductor 326 and/or conductor 328, or merely come into proximity with them instead. In either case, the movement of conductor 356 into closer proximity with conductor 332 increases the capacitance between conductor 332 and ground, which can then be sensed.

Generally, capacitive sensing circuit 360 detects the depression of the key by sensing a change in capacitance of the key. Current sensing circuit 370 senses the increase in capacitance at the output terminals of current sources 362 and 364. Controller 376 senses the change in capacitance using a successive approximation technique. Controller 376 successively alters the sizes of current source 362 until current sources 362 and 264 charge their corresponding capacitors at substantially the same rate, and trip their comparators at substantially the same time.

In particular, first circuitry (comparator 372) in capacitive sensing circuit 360 generates a first indication when a variable voltage across the variable capacitor exceeds a threshold voltage $V_{REF}$. Second circuitry (comparator 374) generates a second indication when a reference voltage across a reference capacitor (capacitor 366) exceeds the threshold voltage. Control logic (controller 376) is responsive to the first and second indications and generates a control signal (not shown in FIG. 3) indicating whether the first indication or the second indication occurs first. A successive approximation engine generates an N-bit control value responsive to the control signal. A variable current source (current source 362) is responsive to the N-bit control value for generating a variable current to the first circuitry. A reference current source (current source 364) generates a reference current to the second circuitry.

In an alternate embodiment, current source 364 can be made programmable by controller 376, like current source 362. Adding this programmability increases the flexibility of controller 376 in sensing the depression of the key and in discriminating between valid depressions of the key and attempts to hack the keypad. Moreover in other embodiments, capacitive sensing circuit 360 can be implemented by other circuits, such as analog-to-digital converters using other conversion methods besides successive approximation, differential voltage sensors, and the like. Moreover controller 376 can be implemented with hardware, software, or some combination of the two.

Keypad system 300 adds additional security by using capacitive sensing to a fixed voltage and then burying the other, variable plate from top surface 312 of PCB substrate 310 by insulative intervening layer 320. This separation prevents a hacker from attaching a contact to conductor 332 without destructive etching or sawing, which itself could be detected by a change in capacitance due to the change in the insulating dielectric. In order to detect the hacker's attempt to reach conductor 332, keypad system 300 can use additional, conventional sensors such as those described above. In addition by placing the keypad on the side of PCB substrate 310 opposite to the active surface, the MCU implementing capacitive sensing circuit 360 can be soldered to PCB substrate 310 such that conductor 342 is not exposed to bottom surface 314 and could include additional sensors to detect attempts to remove or desolder the MCU. Thus, disposing the keypad on the surface opposite to the active surface of the PCB facilitates even greater security.

In an alternative embodiment, the keypad system could include a flexible membrane which is retracted by the user, with a capacitive sensing circuit similar to capacitive sensing circuit 350 that detects a decrease in capacitance.

In the disclosed embodiment, PCB substrate 310 is formed of fiberglass which is hard and inflexible. In other embodiments, however, PCB substrate 310 may be formed by other materials besides fiberglass, such as flexible substrate materials. Also the plunger can actually come into contact with the conductors at the top surface.

Moreover conductor 332 can be split into two semicircular pieces to allow a reduction in the number of input and output signal lines between the keypad and the MCU. In this split-conductor keypad, one semicircular piece would be connected to a row, and the other to a column. Such a technique would reduce the number of input/output lines required to interface to the MCU, in the example of the telephone keypad, from twelve to seven. In this case all the conductors on each row and on each column would be wire-ORed together, and the MCU could detect an active key as the key at the intersection of an active row and an active column.

Moreover in other embodiments, the common capacitor plate need not be earth ground could be replaced by another voltage terminal such as analog ground, a virtual ground, a generated voltage such as a bandgap voltage, and the like.

Figure 4:
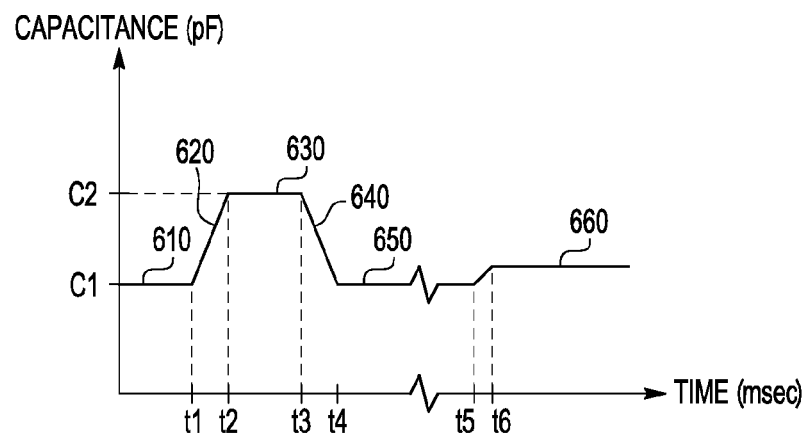
FIG. 4 illustrates a graph useful in understanding the operation of the keypad of FIG. 3.

FIG. 4 illustrates a graph 400 useful in understanding the operation of keypad system 300 of FIG. 3. In graph 400, the horizontal axis represents time in milliseconds (ms), and the vertical axis represents capacitance in picofarads (pF). The fixed capacitance that exists between conductor 332 and ground, through conductors 326 and 328, is labeled "C1". To a time labeled "t1", the key is not depressed and the capacitance remains at a value of C1 over a portion of the curve 610. At a time labeled "t2", a user depresses the key. The capacitance makes a transition from C1 to a second, higher value labeled "C2" at time t2 over a portion of the curve 620. Between time t2 and a time labeled "t3", the key remains depressed over a portion of the curve 630. At t3, the user removes his or her finger from the key. Between time t3 and a time labeled "t4" the flexible membrane returns to its initial shape and conductor 356 moves upward, away from top surface 312, reducing the capacitance from C2 to C1 over a portion of the curve 640. After the flexible membrane has returned to its original state, the capacitance remains at C1 over a portion of the curve 650.

However as shown in FIG. 4, keypad system 300 is also able to detect attempts by a hacker to access it. Thus between a time labeled "t5" and a subsequent time labeled "t6" the proximity of wires inserted by a hacker increases the capacitance to ground after t6 during a portion of the curve 660. Since portion 660 has a different capacitance that portion 630, the MCU can identify it not as the depression of a key, but a hacking attempt, and take appropriate measures such as disabling the system. The MCU is able to use software or firmware stored therein to intelligently distinguish the depression of a key and attempts to hack the keypad. The MCU, however, should also monitor changes in capacitance as environmental conditions change to avoid a false hacker alarm.

Figure 5:
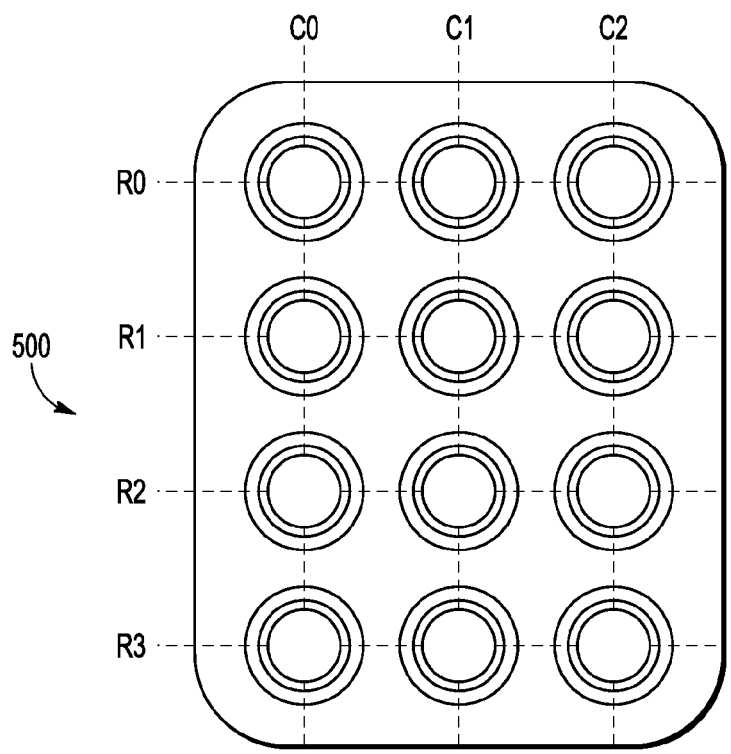
FIG. 5 illustrates a top view of a flexible membrane for use with the keypad system of FIG. 3.
Figure 6:
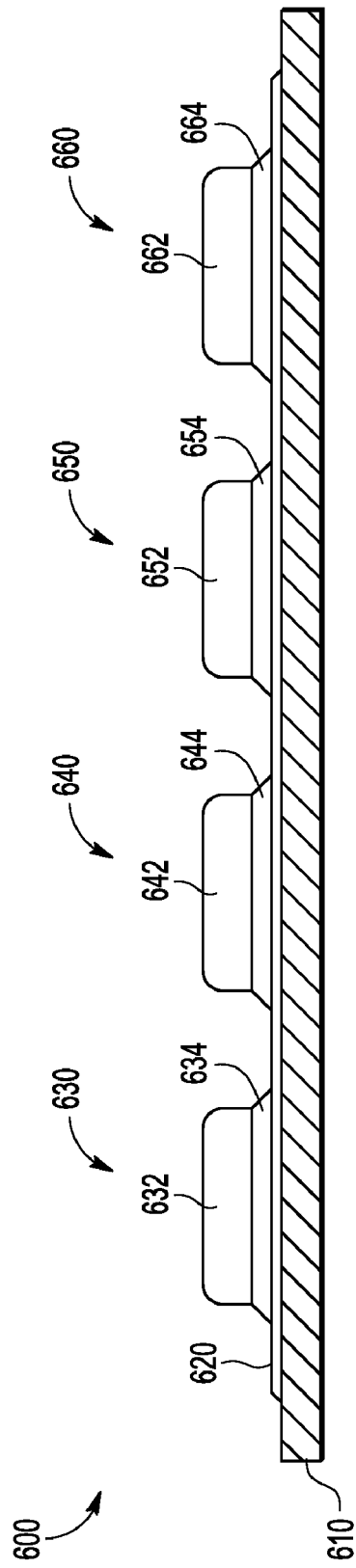
FIG. 6 illustrates a side view of the flexible membrane of FIG. 5.

FIG. 5 illustrates a top view of a flexible membrane 500 for use with the keypad system of FIG. 3 and implementing a telephone keypad similar to that shown in FIG. 1. The flexible membrane includes outward protrusions at locations corresponding to keys of the telephone keypad, arranged in rows and columns in the manner described with respect to FIG. 1. To implement a full keypad system, a user would overlay the flexible membrane with, for example, metal or plastic key caps having the writing or symbols to identify the corresponding keys to the user. FIG. 6 illustrates a side view 600 of flexible membrane 500 of FIG. 5. Side view 600 reveals that flexible membrane 500 of FIG. 5 includes a base portion 610, a ridge 620, and four key portions 630, 640, 650, and 660 corresponding to the four keys in an edge column such as column C0. For example, key portion 630 forms a protrusion with an upper portion 632 and a lower flared portion 634. Likewise, key portions 640, 650, 660 form protrusions that include respective upper portions 642, 652, and 662 and their corresponding lower flared portions 644, 654, and 664.

Note that a telephone keypad is just one example of the use to which the keypad system 300 of FIG. 3 can be put. Other examples include ATM keypads, point-of-sale keypads, and the like. In particular, ATM keypads require extra security measures due to the their use for entering personal identification numbers that a hacker can use to steal cash. Moreover, a keypad system as disclosed herein can be used for all shapes of keypads, including single actuator keypads and keypads with keys disposed in irregular patterns. In addition, while not required, the inventor contemplates that the disclosed keypad system would be used in conjunction with other, conventional security features such as hardware theft detection sensors.

Thus the above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A keypad system comprising:
a substrate having a top surface, a first conductor below said top surface, an insulator layer separating said first conductor from said top surface, and a second conductor disposed in proximity to said first conductor and to said top surface and coupled to a voltage terminal;
a flexible membrane disposed above said top surface of said substrate and having a third conductor movable in a direction toward said top surface; and
a capacitive sensing circuit coupled to said first conductor for sensing a change in capacitance between said first conductor and said voltage terminal when said third conductor moves relative to said top surface.

2. The keypad system of claim 1 wherein said second conductor is formed in said insulator layer.

3. The keypad system of claim 1 wherein said voltage terminal comprises a ground terminal.

4. The keypad system of claim 1 wherein said substrate comprises fiberglass.

5. The keypad system of claim 1 wherein said substrate comprises a flexible material.

6. The keypad system of claim 1 wherein said capacitive sensing circuit comprises a microcontroller.

7. The keypad system of claim 1 wherein said substrate further comprises a bottom surface characterized as being an active surface.

8. A keypad system defined by a plurality of key locations, comprising:
a substrate having:
a top surface;
a first conductor layer below said top surface having a plurality of first conductors corresponding to each key location of the plurality of key locations;
an insulator layer separating said first conductor layer from said top surface; and
a second conductor disposed in proximity to said first conductor layer and to said top surface and coupled to a voltage terminal; and
a flexible membrane disposed above said top surface of said substrate and having a plurality of third conductors corresponding to each key location of the plurality of key locations, each of said plurality of third conductors independently movable in a direction toward said top surface; and
a capacitive sensing circuit coupled to each of said plurality of first conductors for sensing a change in capacitance between each of said plurality of first conductors and said voltage terminal when a corresponding third conductor of said plurality of third conductors moves relative to said top surface.

9. The keypad system of claim 8 wherein the plurality of key locations comprises a matrix of key locations formed at intersections of a plurality of rows and a plurality of columns.

10. The keypad system of claim 8 wherein said second conductor is formed in said insulator layer.

11. The keypad system of claim 8 wherein said voltage terminal comprises a ground terminal.

12. The keypad system of claim 8 wherein said substrate comprises fiberglass.

13. The keypad system of claim 8 wherein said substrate comprises a flexible material.

14. The keypad system of claim 8 wherein said capacitive sensing circuit comprises a microcontroller.

15. The keypad system of claim 8 wherein said substrate further comprises a bottom surface characterized as being an active surface.

16. A keypad comprising:
a substrate having:
a top surface;
a first conductor below said top surface;
an insulator layer separating said first conductor from said top surface; and
a second conductor disposed in proximity to said first conductor and to said top surface and coupled to a voltage terminal; and
a flexible membrane disposed above said top surface of said substrate and having a third conductor forming a key, said third conductor movable relative to said top surface.

17. The keypad of claim 16 wherein said second conductor is formed in said insulator layer.

18. The keypad of claim 16 wherein said substrate comprises fiberglass.

19. The keypad of claim 16 wherein said substrate comprises a flexible material.

20. The keypad of claim 16 wherein said substrate further comprises a bottom surface characterized as being an active surface.

21. The keypad of claim 16 further comprising a metallic cap overlying said flexible membrane and substantially overlying said first conductor.

* * * * *